(12) United States Patent
Chou et al.

(10) Patent No.: US 12,568,835 B2
(45) Date of Patent: Mar. 3, 2026

(54) CHIP-ON-BOARD MODULE

(71) Applicant: Winbond Electronics Corp., Taichung (TW)

(72) Inventors: Yen-Ling Chou, Changhua (TW); Bo-Ren Chi, Taichung (TW); Wei-Ting Chang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 692 days.

(21) Appl. No.: 17/886,896

(22) Filed: Aug. 12, 2022

(65) Prior Publication Data

US 2023/0058607 A1 Feb. 23, 2023

(30) Foreign Application Priority Data

Aug. 18, 2021 (TW) ................................. 110130462

(51) Int. Cl.
H01L 23/498 (2006.01)
H01L 23/13 (2006.01)
H01L 23/538 (2006.01)

(52) U.S. Cl.
CPC ........ H01L 23/49838 (2013.01); H01L 23/13 (2013.01); H01L 23/5386 (2013.01)

(58) Field of Classification Search
CPC .............. H01L 23/49838; H01L 23/13; H01L 23/5386
See application file for complete search history.

(56) References Cited

U.S. PATENT DOCUMENTS

| | | | |
|---|---|---|---|
| 5,410,182 A | 4/1995 | Kurafuchi et al. | |
| 8,754,513 B1 * | 6/2014 | Chen ...................... | H01L 24/43 257/784 |
| 2008/0258280 A1 * | 10/2008 | Seo ................... | H01L 23/49541 257/676 |

FOREIGN PATENT DOCUMENTS

| | | | |
|---|---|---|---|
| KR | 155440 B1 * | 10/1998 | |
| TW | 201138046 A | 11/2011 | |

* cited by examiner

*Primary Examiner* — Michele Fan
(74) *Attorney, Agent, or Firm* — Birch, Stewart, Kolasch & Birch, LLP

(57) ABSTRACT

A chip-on-board module is provided. The chip-on-board module includes a chip and a substrate. The chip includes a plurality of chip contacts. The substrate includes a plurality of first leads and a plurality of second leads. The first leads and the second leads are coupled to a portion of the chip contacts. The first leads are arranged along a first axis. The second leads are arranged along a second axis. A first axis included angle is formed between the first axis and the second axis, and the first axis included angle is between 100° and 170°.

12 Claims, 2 Drawing Sheets

M2

CHIP-ON-BOARD MODULE

CROSS REFERENCE TO RELATED APPLICATIONS

This application claims priority of Taiwan Patent Application No. 110130462, filed on Aug. 18, 2021, the entirety of which is incorporated by reference herein.

BACKGROUND OF THE INVENTION

Field of the Invention

The present invention relates to a chip-on-board module, and in particular to a chip-on-board module with more chip contacts.

Description of the Related Art

The conventional chip-on-board module has a chip and a substrate. The chip comprises a plurality of chip contacts, and is disposed in an opening of the substrate. The substrate has a plurality of leads which are adjacent to the opening. Each chip contact is coupled to one lead by one trace. With the increased requirements on the functions of the chip, the number of chip contacts has increased. Restricted by the line width and gap distance of the leads, the size of the substrate must be increased to match the increased number of chip contacts. The size of the electronic device utilizing the chip-on-board module is increased. Additionally, since the size of the substrate has changed, the manufacturing equipment must be changed, and the manufacturing cost is thus increased.

Conventionally, the leads may be arranged around the opening to reduce the size of the substrate. However, the locations of the leads cannot match the chip contacts, and the traces connecting the chip contacts and the leads may interfere with each other.

BRIEF SUMMARY OF THE INVENTION

Embodiments of the invention are provided to address the aforementioned difficulty.

In one embodiment, a chip-on-board module is provided. The chip-on-board module includes a chip and a substrate. The chip includes a plurality of chip contacts. The substrate includes a plurality of first leads and a plurality of second leads, wherein the first leads and the second leads are coupled to a portion of the chip contacts, the first leads are arranged along a first axis, the second leads are arranged along a second axis, a first axis included angle is formed between the first axis and the second axis, and the first axis included angle is between 100° and 170°.

In the chip-on-board module of the embodiment of the invention, the leads are arranged around the chip to decrease the size of the substrate. The first leads and the second leads are arranged in a particular way (the first axis included angle is between 100° and) 170° to prevent the interference between the traces. The density of the leads is increased, and the lengths of the traces are decreased. By the chip-on-board module of the embodiment of the invention, the thickness of the electronic device can be reduced, and the manufacturing cost can be decreased.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
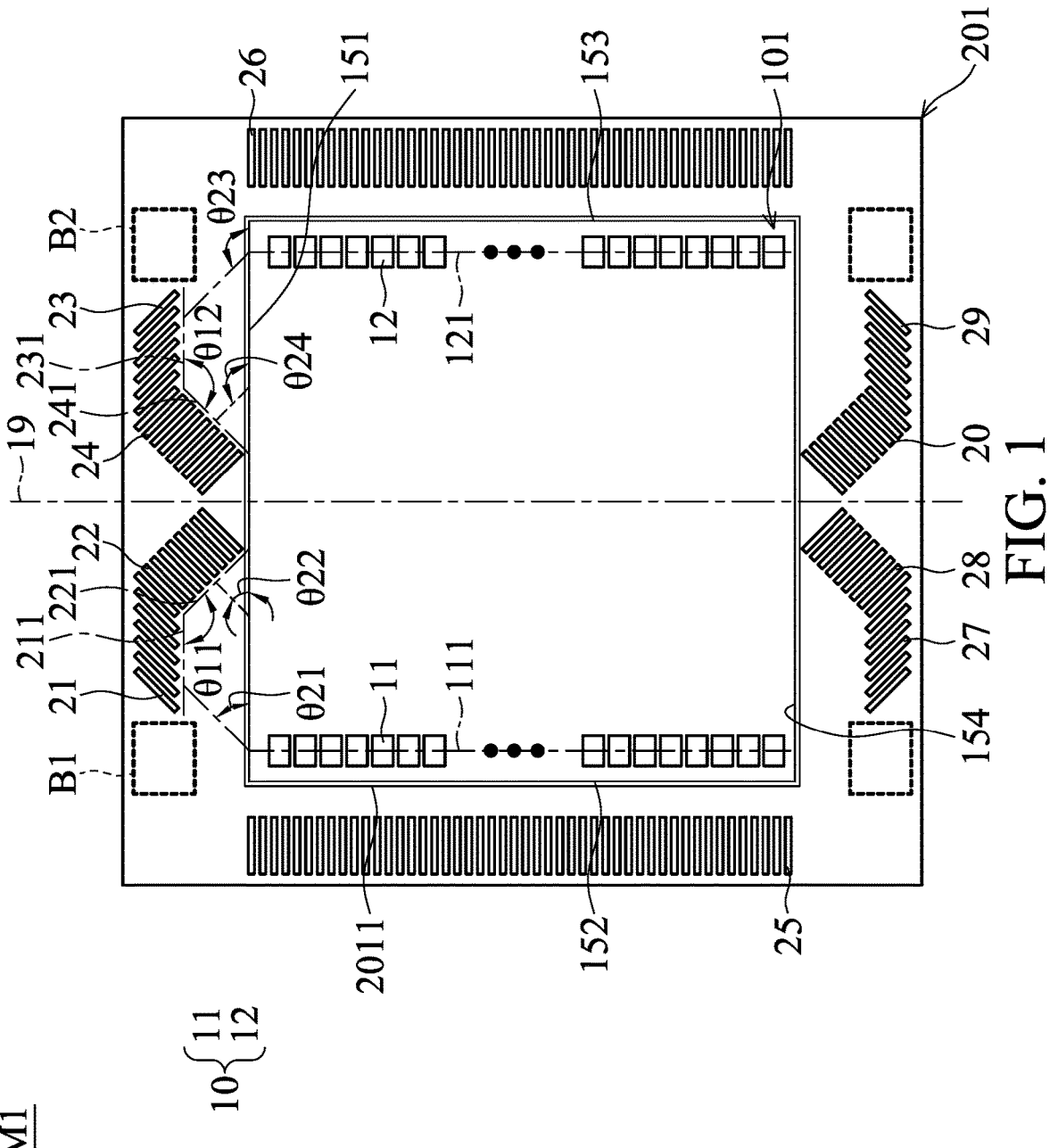
FIG. 1 shows a chip-on-board module of a first embodiment of the invention.

With reference to FIG. 1, the chip-on-board module M1 includes a chip 101 and a substrate 201. The chip 101 includes a plurality of chip contacts 10. The substrate 201 includes a plurality of first leads 21 and a plurality of second leads 22. The first leads 21 and the second leads 22 are coupled to a portion of the chip contacts 10. The first leads 21 are arranged along a first axis 211. The second leads 22 are arranged along a second axis 221. A first axis included angle θ 11 is formed between the first axis 211 and the second axis 221, and the first axis included angle θ 11 is between 100° and 170°. In one embodiment, the first axis included angle θ 11 can be between 115° and 155°. For example, the first axis included angle θ 11 can be 135°.

In the drawings of the embodiment of the invention, to clearly show the details of the embodiment, the size of the chip contacts are enlarged, and a portion of the chip contacts are briefly presented by dots. The size, angle, length disclosed in the drawings of the embodiment are not meant to restrict the invention.

With reference to FIG. 1, in one embodiment, the first leads 32 and the second leads 22 are adjacent to a first edge of an opening 2011. The first leads 32 and the second leads 22 correspond to the first chip edge 151 of the chip 101.

In one embodiment, a first lead dip angle θ 21 is formed between each first lead 21 and the first chip edge 151, the first lead dip angle θ 21 is between 20° and 70°. A second lead dip angle θ 22 is formed between each second lead 22 and the first chip edge 151, the second lead dip angle is between 20° and 70°. In one embodiment, the first lead dip angle θ 21 is equal to the second lead dip angle θ 22. For example, the first lead dip angle θ 21 and the second lead dip angle θ 22 can both be 30°.

In one embodiment, each first lead 21 is a straight element which is tilt relative to the first chip edge 151, and the first leads 21 are parallel to each other. Each second lead 22 is a straight element which is tilt relative to the first chip edge 151, and the second leads 22 are parallel to each other. In one embodiment, the first axis 211 is parallel to the first chip edge 151.

With reference to FIG. 1. in one embodiment, the substrate 201 further comprises a plurality of third leads 23 and a plurality of fourth leads 24. The third leads 23 and the fourth leads 24 are coupled to a portion of the chip contacts 10. The third leads 23 and the fourth leads 24 are adjacent to one side of the opening 2011, and correspond to the first chip edge 151 of the chip 201. A third lead dip angle θ 23 is formed between each third lead 23 and the first chip edge 151. A fourth lead dip angle θ 24 is formed between each fourth lead 24 and the first chip edge 151. The third lead dip angle θ 23 differs from the first lead dip angle θ 21 and the second lead dip angle θ 22, and the fourth dip angle θ 24 differs from the first lead dip angle θ 21 and the second lead dip angle θ 22. In one embodiment, the third lead dip angle θ 23 is equal to the fourth dip angle θ 24.

In one embodiment, each third lead 23 is a straight element which is tilt relative to the first chip edge 151, and the third leads 23 are parallel to each other. Each fourth lead 24 is a straight element which is tilt relative to the first chip edge 151, and the fourth leads 24 are parallel to each other.

In one embodiment, the third leads 23 are arranged in a third axis 231. The fourth leads 24 are arranged in a fourth axis 241. A second axis included angle θ 12 is formed between the third axis 231 and the fourth axis 241, and the second axis included angle θ 12 is between 100° and 170°. In one embodiment, the second axis included angle θ 12 can be between 115° and 155°. For example, the second axis included angle θ 12 can be 135°.

In one embodiment, the second axis 211 and the third axis 231 are parallel to the first chip edge 151. In one embodiment, the second axis 221 and the fourth axis 241 are symmetric to a bisector line 19 of the chip 101, and the bisector line 19 is perpendicular to the first chip edge 151.

In one embodiment, the chip contacts 10 comprise a plurality of first chip contacts 11 and a plurality of second chip contacts 12. The first chip contacts 11 are arranged in a first straight line 111. The second chip contacts 12 are arranged in a second straight line 121. The chip 101 comprises a second chip edge 152 and a third chip edge 153. The second chip edge 152 is perpendicular to the first chip edge 151. The third chip edge 153 is perpendicular to the first chip edge 151. The first straight line 111 is parallel to the second chip edge 152. The second straight line 121 is parallel to the third chip edge 153. The first leads 21 and the second leads 22 are coupled to a portion of the first chip contacts 11. The third leads 23 and the fourth leads 24 are coupled to a portion of the second chip contacts 12.

Figure 2:
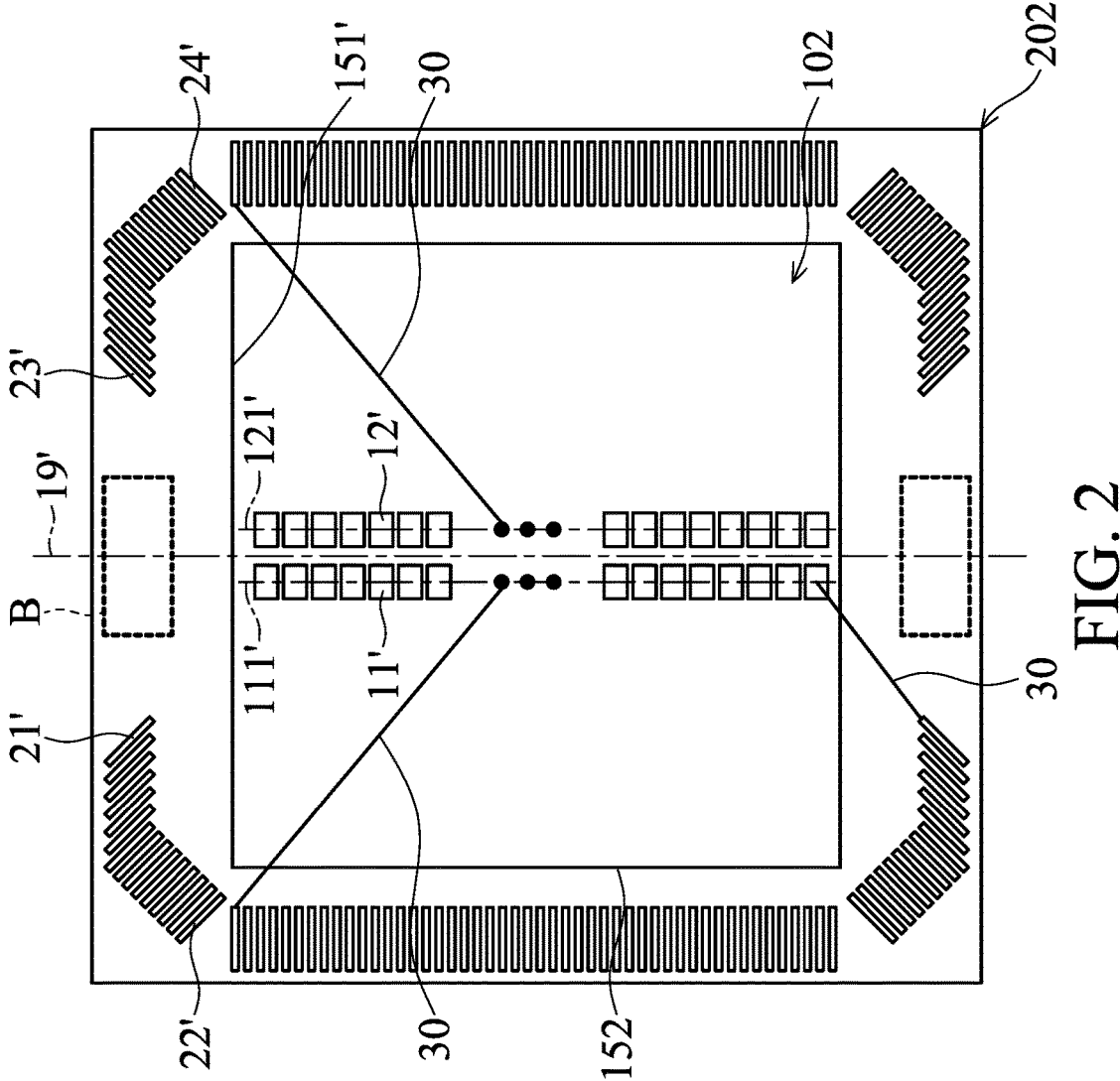
FIG. 2 shows a chip-on-board module of a second embodiment of the invention.

In one embodiment, as shown in FIG. 2, the leads are coupled to the neighboring chip contacts by trace 30 (the trace 30 is presented in FIG. 2 for example, and the disclosure is not meant to restrict the invention). The first leads 21' and the second leads 22' adjacent to the first chip edge 151' are coupled to the chip contacts 11' relatively adjacent to the first chip edge 151'. The third leads 23' and the fourth leads 24' adjacent to the first chip edge 151' are coupled to the chip contacts 12' relatively adjacent to the first chip edge 151'. For example, the first leads with a quantity of N and the second leads with a quantity of M are coupled to the first chip contacts with a quantity of (N+M) by the traces, wherein the first chip contacts are adjacent to the first chip edge.

With reference to FIG. 1, in one embodiment, the first chip contacts 11 are arranged adjacent to the second chip edge 152. The second chip contacts 12 are arranged adjacent to the third chip edge 153. The first leads 12 are near the first chip contacts 11 (which are most adjacent to the first chip edge 151) relative to the second leads 22. The third leads 23 are near the second chip contacts 12 (which are most adjacent to the first chip edge 151) relative to the fourth leads 24.

In one embodiment, the substrate 201 further comprises a first empty area B1 and a second empty area B2. The first empty area B1 is on the first straight line 111. The second empty area B2 is on the second straight line 121. There is no lead in the first empty area B1 or the second empty area B2. The width of the first empty area B1 is greater than twice the width of each first chip contact 11. The width of the second empty B2 area is greater than twice the width of each second chip contact 12.

In one embodiment, the substrate 201 further includes a plurality of fifth leads 25 and a plurality of sixth leads 26. The fifth leads 25 are adjacent to a second edge of the opening 2011, and correspond to the second chip edge 152. The sixth leads 26 are adjacent to a third edge of the opening 2011, and correspond to the third chip edge 153. The fifth leads 25 are parallel to each other, and the extending direction of the fifth lead 25 is perpendicular to the second chip edge 152. The sixth leads 26 are parallel to each other, and the extending direction of the sixth lead 26 is perpendicular to the third chip edge 153. The fifth leads 25 are coupled to the first chip contacts 11 which are located in the central portion of the chip. The sixth leads 26 are coupled to the second chip contacts 12 which are located in the central portion of the chip. As shown in FIG. 2, the leads extending perpendicular to the second chip edge 152 are coupled to the first chip contacts 11' and the second chip contacts 12' which are located in the central portion of the chip by traces.

In one embodiment, the substrate 201 further includes a plurality of seventh leads 27, a plurality of eighth leads 28, a plurality of ninth leads 29 and a plurality of tenth leads 20. The seventh leads 27, the eighth leads 28, the ninth leads 29 and the tenth leads 20 are adjacent to a fourth edge of the opening 2011, and correspond to a fourth chip edge 154. The structures of the seventh leads 27, the eighth leads 28, the ninth leads 29 and the tenth leads 20 are similar to the first lead 21, the second lead 22, the third lead 23 and the fourth lead 24, and the detailed description is omitted.

With reference to FIG. 2, the chip-on-board module M2 of the second embodiment of the invention includes a chip 102 and a substrate 202. The chip 102 includes a plurality of first chip contacts 11' and a plurality of second chip contacts 12'. The substrate 202 includes a plurality of first leads 21', a plurality of second leads 22', a plurality of third leads 23' and a plurality of fourth leads 24'. In one embodiment, the first chip contacts 11' and the second chip contacts 12' are symmetric to a bisector line 19' of the chip 102. The bisector line 19' is perpendicular to the first chip edge 151' of the chip 102. The first chip contacts 11' and the second chip contacts 12' are arranged adjacent to the bisector line 19'. The first leads 21' are near the first chip contacts 11' (which are most adjacent to the first chip edge 151') relative to the second leads 22'. The third leads 23' are near the second chip contacts 12' (which are most adjacent to the first chip edge 151') relative to the fourth leads 35'.

In one embodiment, the substrate 202 further comprises an empty area B, and there is no lead in the empty area B. The first chip contacts 11' are arranged in a first straight line 111'. The second chip contacts 12' are arranged in a first straight line 121'. The first straight line 111' and the second straight line 121' extend through the empty area B. The empty area B is located between the first leads 21' and the third leads 23'. The width of the empty area B is greater than the distance between the first straight line 111' and the second straight line 121'.

In the chip-on-board module of the embodiment of the invention, the leads are arranged around the chip to decrease the size of the substrate. The first leads and the second leads are arranged in a particular way (the first axis included angle is between 100° and) 170° to prevent the interference between the traces. The density of the leads is increased, and the lengths of the traces are decreased. By the chip-on-board module of the embodiment of the invention, the thickness of the electronic device can be reduced, and the manufacturing cost can be decreased.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip-on-board module, comprising:

a chip, comprising a plurality of chip contacts; and a substrate, which comprises a plurality of first leads and a plurality of second leads, wherein the first leads and the second leads are coupled to a portion of the chip contacts, the first leads are arranged along a first axis, the second leads are arranged along a second axis, a first axis included angle is formed between the first axis and the second axis, and the first axis included angle is between 100° and 170°, wherein the first leads and the second leads are formed on a first side of a bisector line of the chip and correspond to a first chip edge of the chip, and the first leads and the second leads are coupled to a portion of the chip contacts which are adjacent to the first chip edge, wherein the substrate further comprises a plurality of third leads and a plurality of fourth leads, the third leads and the fourth leads are coupled to a portion of the chip contacts, the third leads and the fourth leads are formed on a second side of the bisector line of the chip and correspond to the first chip edge of the chip, the first side of the bisector line of the chip and the second side of the bisector line of the chip are opposite, wherein a first lead dip angle is formed between each first lead and the first chip edge, a second lead dip angle is formed between each second lead and the first chip edge, a third lead dip angle is formed between each third lead and the first chip edge, a fourth lead dip angle is formed between each fourth lead and the first chip edge, the third lead dip angle differs from the first lead dip angle and the second lead dip angle, and the fourth dip angle differs from the first lead dip angle and the second lead dip angle, wherein the third leads are arranged in a third axis, the fourth leads are arranged in a fourth axis, a second axis included angle is formed between the third axis and the fourth axis, and the second axis included angle is between 100° and 170°, wherein the chip contacts comprise a plurality of first chip contacts and a plurality of second chip contacts, the first chip contacts are arranged in a first straight line, the second chip contacts are arranged in a second straight line, the chip comprises a second chip edge and a third chip edge, the second chip edge is perpendicular to the first chip edge, the third chip edge is perpendicular to the first chip edge, the first straight line is parallel to the second chip edge, the second straight line is parallel to the third chip edge, the first leads and the second leads are coupled to a portion of the first chip contacts, and the third leads and the fourth leads are coupled to a portion of the second chip contacts, wherein the first chip contacts are formed on the first side of the bisector line of the chip, the second chip contacts are formed on the second side of the bisector line of the chip, the first leads are near the first chip contacts relative to the second leads, and the third leads are near the second chip contacts relative to the fourth leads, wherein the substrate further comprises a first empty area and a second empty area, the first empty area is on the first straight line, the second empty area is on the second straight line, there is no lead in the first empty area or the second empty area;

wherein the first leads and the second leads are located closer to the bisector line of the chip than the first empty area and the second empty area.

2. The chip-on-board module as claimed in claim 1, wherein the first lead dip angle is between 20° and 70°, and the second lead dip angle is between 20° and 70°.

3. The chip-on-board module as claimed in claim 1, wherein the first lead dip angle is equal to the second lead dip angle.

4. The chip-on-board module as claimed in claim 1, wherein the first axis is parallel to the first chip edge.

5. The chip-on-board module as claimed in claim 1, wherein the third lead dip angle is equal to the fourth lead dip angle, the first axis is parallel to the first chip edge, and the third axis is parallel to the first chip edge.

6. The chip-on-board module as claimed in claim 1, wherein the second axis and the fourth axis are symmetric to the bisector line of the chip, and the bisector line is perpendicular to the first chip edge.

7. The chip-on-board module as claimed in claim 1, wherein the first chip contacts are adjacent to the second chip edge, the second chip contacts are adjacent to the third chip edge.

8. The chip-on-board module as claimed in claim 1, wherein a width of the first empty area is greater than twice a width of each first chip contact, and a width of the second empty area is greater than twice a width of each second chip contact.

9. A chip-on-board module, comprising:

a chip, comprising a plurality of chip contacts; and a substrate, which comprises a plurality of first leads and a plurality of second leads, wherein the first leads and the second leads are coupled to a portion of the chip contacts, the first leads are arranged along a first axis, the second leads are arranged along a second axis, a first axis included angle is formed between the first axis and the second axis, and the first axis included angle is between 100° and 170°, wherein the substrate further comprises a plurality of third leads and a plurality of fourth leads, the third leads and the fourth leads are coupled to a portion of the chip contacts, wherein the third leads are arranged in a third axis, the fourth leads are arranged in a fourth axis, a second axis included angle is formed between the third axis and the fourth axis, wherein the first leads and the second leads are formed on a first side of a bisector line of the chip and correspond to a first chip edge of the chip, and the third leads and the fourth leads are formed on a second side of the bisector line of the chip and correspond to the first chip edge of the chip, the first side of the bisector line of the chip and the second side of the bisector line of the chip are opposite, wherein the chip contacts comprise a plurality of first chip contacts and a plurality of second chip contacts, the first chip contacts are arranged in a first straight line, the second chip contacts are arranged in a second straight line, the chip comprises a second chip edge and a third chip edge, the second chip edge is perpendicular to the first chip edge, the third chip edge is perpendicular to the first chip edge, the first straight line is parallel to the second chip edge, the second straight line is parallel to the third chip edge, the first leads and the second leads are coupled to a portion of the first chip contacts, and the third leads and the fourth leads are coupled to a portion of the second chip contacts, wherein the substrate further comprises an empty area on the first straight line or the second straight line, there is no lead in the empty area;

wherein the first leads and the second leads are located closer to the bisector line of the chip than the first empty area and the second empty area.

10. The chip-on-board module as claimed in claim 9, wherein the first chip contacts and the second chip contacts are symmetric to the bisector line of the chip, the bisector line is perpendicular to the first chip edge, the first leads are near the first chip contacts relative to the second leads, the third leads are near the second chip contacts relative to the fourth leads.

11. The chip-on-board module as claimed in claim 9, wherein the empty area is located on a side of the first leads or the third leads.

12. The chip-on-board module as claimed in claim 9, wherein a width of the empty area is greater than twice the width of each first chip contact or twice the width of each second chip contact.

* * * * *